United States Patent
Tsukamoto et al.

(10) Patent No.: US 8,503,143 B2
(45) Date of Patent: Aug. 6, 2013

(54) BATTERY STATE MONITORING CIRCUIT AND BATTERY DEVICE

(75) Inventors: Shohei Tsukamoto, Chiba (JP); Atsushi Sakurai, Chiba (JP); Kazuaki Sano, Chiba (JP)

(73) Assignee: Seiko Instruments Inc., Chiba (JP)

( * ) Notice: Subject to any disclaimer, the term of this patent is extended or adjusted under 35 U.S.C. 154(b) by 301 days.

(21) Appl. No.: 13/105,307

(22) Filed: May 11, 2011

(65) Prior Publication Data

US 2011/0299206 A1 Dec. 8, 2011

(30) Foreign Application Priority Data

Jun. 3, 2010 (JP) .................................. 2010-128282

(51) Int. Cl.
  *H02H 3/00* (2006.01)
(52) U.S. Cl.
  USPC .......................................................... 361/83
(58) Field of Classification Search
  USPC .......................................................... 361/83
  See application file for complete search history.

(56) References Cited

U.S. PATENT DOCUMENTS

| | | | | |
|---|---|---|---|---|
| 5,949,233 | A * | 9/1999 | Mashiko | 324/433 |
| 6,052,016 | A | 4/2000 | Sugiura et al. | |
| 6,346,795 | B2 * | 2/2002 | Haraguchi et al. | 320/136 |
| 6,373,227 | B2 * | 4/2002 | Nakashimo | 320/134 |
| 7,550,947 | B2 * | 6/2009 | Sakurai et al. | 320/134 |
| 2001/0026147 | A1 * | 10/2001 | Nakashimo | 320/134 |

FOREIGN PATENT DOCUMENTS

JP 10-224997 A 8/1998

* cited by examiner

*Primary Examiner* — Ronald W Leja
(74) *Attorney, Agent, or Firm* — Brinks Hofer Gilson & Lione

(57) ABSTRACT

Provided is a battery state monitoring circuit which detects that a voltage of a secondary battery has decreased abruptly because of an overcurrent, thereby being capable of protecting a battery device from an abrupt decrease in voltage of the secondary battery caused by the overcurrent. The battery state monitoring circuit includes a voltage comparator circuit and a power supply voltage detection circuit for detecting an abrupt decrease in power supply voltage, in which the voltage comparator circuit detects a normal overcurrent while the power supply voltage detection circuit detects the abrupt decrease in power supply voltage caused by load short-circuit.

7 Claims, 3 Drawing Sheets

US 8,503,143 B2

BATTERY STATE MONITORING CIRCUIT AND BATTERY DEVICE

RELATED APPLICATIONS

This application claims priority under 35 U.S.C. §119 to Japanese Patent Application No. 2010-128282 filed on Jun. 3, 2010, the entire content of which is hereby incorporated by reference.

BACKGROUND OF THE INVENTION

1. Field of the Invention

The present invention relates to a battery state monitoring circuit for controlling charge/discharge of a secondary battery, and a battery device including the battery state monitoring circuit.

2. Description of the Related Art

A battery state monitoring circuit includes an overcurrent detection circuit for protecting a battery device from an abnormal current, which flows when a load has a problem. Various inventions are disclosed for the overcurrent detection circuit for protecting the battery device (see, for example, Japanese Patent Application Laid-open No. Hei 10-224997).

FIG. 3 illustrates a conventional battery device including a battery state monitoring circuit. A conventional battery device 20 includes a secondary battery 1, a switch circuit 3, a sense resistor 4, and a battery state monitoring circuit 21. The battery state monitoring circuit 21 includes a first reference voltage circuit 5, a second reference voltage circuit 6, a first voltage comparator circuit 7, a second voltage comparator circuit 8, a first PMOS transistor 9, a second PMOS transistor 10, a first current source 14, a second current source 15, a capacitor 13, and a control circuit 2.

The first voltage comparator circuit 7 compares a voltage of the first reference voltage circuit 5 and a voltage of the sense resistor 4 so as to detect an overcurrent. The second voltage comparator circuit 8 compares a voltage of the second reference voltage circuit 6 and the voltage of the sense resistor 4 so as to detect an overcurrent. Here, the voltage of the first reference voltage circuit 5 is lower than the voltage of the second reference voltage circuit 6. The first PMOS transistor 9, the second PMOS transistor 10, the first current source 14, the second current source 15, and the capacitor 13 together form a delay circuit. The control circuit 2 receives a detected signal from the delay circuit and controls the switch circuit 3.

The above-mentioned battery state monitoring circuit 21 operates as follows to function to protect the battery device 20 from an overcurrent.

If a load connected between external terminals +VO and −VO of the battery device 20 has a problem and an abnormal current flows, the voltage across the sense resistor 4 is increased. Then, if the voltage of the sense resistor 4 exceeds the voltage of the first reference voltage circuit 5, the first voltage comparator circuit 7 detects an overcurrent and outputs a signal of L. The first PMOS transistor 9 is turned ON, and accordingly the capacitor 13 is charged with a current of the first current source 14. The control circuit 2 receives a detected signal from the delay circuit after a predetermined delay time period. Then, the control circuit 2 turns OFF the switch circuit 3 to interrupt a current path.

If the load becomes a short-circuit state and a larger amount of current flows, a voltage of the secondary battery 1 is abruptly decreased. On this occasion, if the voltage of the sense resistor 4 exceeds the voltage of the second reference voltage circuit 6, the second voltage comparator circuit 8 detects an overcurrent under the short-circuit state and outputs a signal of L. Therefore, the capacitor 13 is charged with the current of the first current source 14 and a current of the second current source 15. In other words, the delay time period is shortened so that the control circuit 2 may turn OFF the switch circuit 3 more rapidly.

However, if the secondary battery 1 has not been charged sufficiently or the secondary battery 1 has degraded because of the life, the voltage of the secondary battery 1 is abruptly decreased by the overcurrent even before the load becomes the short-circuit state. In this case, the conventional battery state monitoring circuit 21 has a problem that the second voltage comparator circuit 8 does not detect the overcurrent under the load short-circuit state and hence a desired delay time period cannot be obtained.

SUMMARY OF THE INVENTION

In order to solve the conventional problem, a battery state monitoring circuit and a battery device according to the present invention are configured as follows.

A battery state monitoring circuit according to the present invention includes a voltage comparator circuit and a power supply voltage detection circuit for detecting an abrupt decrease in power supply voltage, in which the voltage comparator circuit detects a normal overcurrent while the power supply voltage detection circuit detects the abrupt decrease in power supply voltage caused by load short-circuit or the like.

A battery device according to the present invention includes the battery state monitoring circuit.

According to the battery state monitoring circuit and the battery device of the present invention, in the case where the secondary battery has not been charged sufficiently or the secondary battery has degraded because of the life, the battery device can be protected from the abrupt decrease in voltage of the secondary battery, which is caused by the overcurrent, even before a load becomes a short-circuit state.

DETAILED DESCRIPTION OF THE PREFERRED EMBODIMENT

Figure 1:
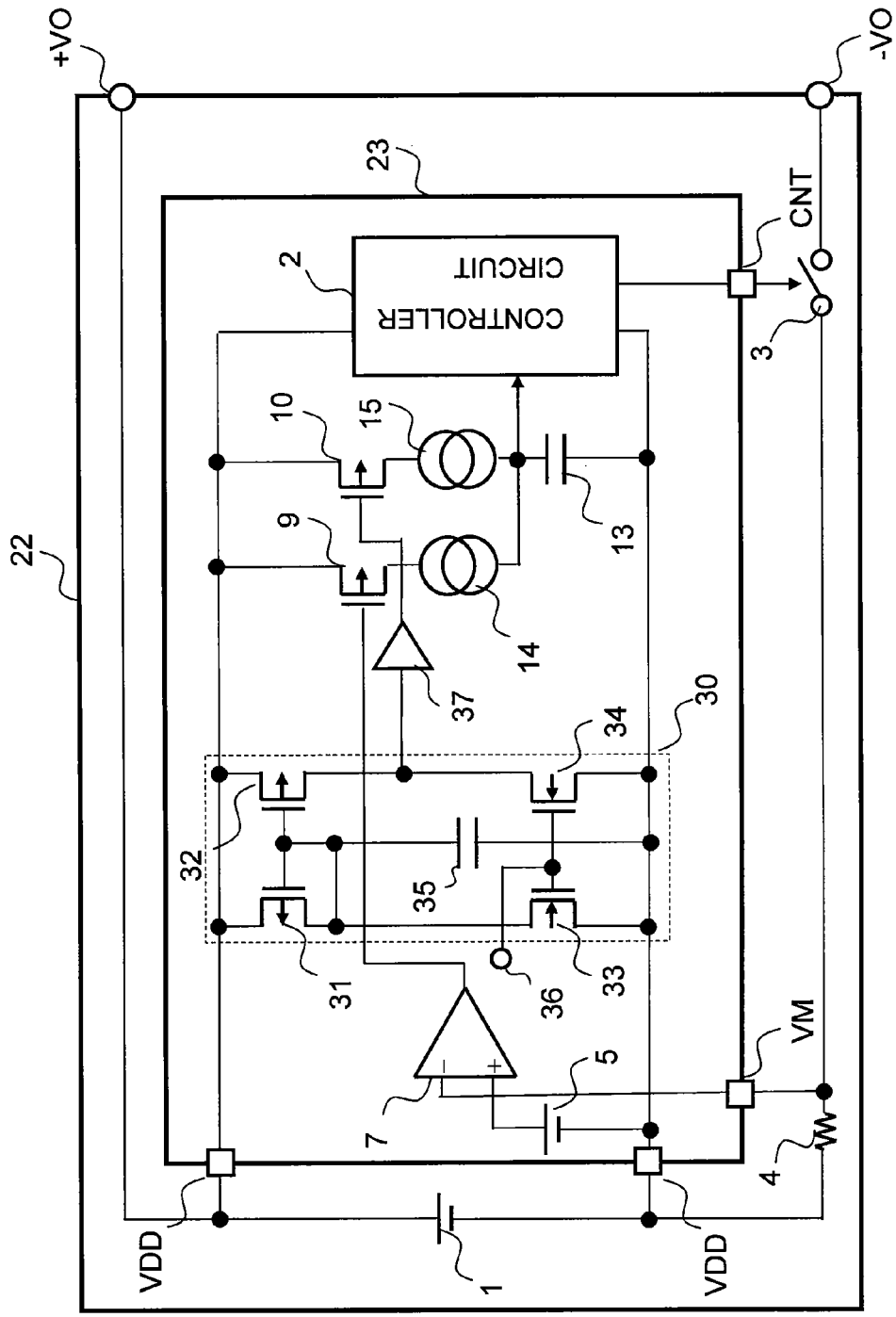
FIG. 1 is a circuit diagram illustrating a battery device including a battery state monitoring circuit according to an embodiment of the present invention.

FIG. 1 is a circuit diagram of a battery device including a battery state monitoring circuit according to an embodiment of the present invention.

A battery device 22 according to the embodiment of the present invention includes a secondary battery 1, a switch circuit 3 for controlling charge/discharge of the secondary battery 1, a sense resistor 4, and a battery state monitoring circuit 23. The battery state monitoring circuit 23 includes an overcurrent detection circuit and a control circuit 2. The overcurrent detection circuit includes a first reference voltage circuit 5, a first voltage comparator circuit 7, a power supply voltage detection circuit 30, a buffer circuit 37, a first PMOS transistor 9, a second PMOS transistor 10, a first current source 14, a second current source 15, and a capacitor 13.

The secondary battery 1, the switch circuit 3, and the sense resistor 4 are connected in series between an external terminal +VO and an external terminal −VO of the battery device 22. The battery state monitoring circuit 23 has a power supply terminal VDD and a power supply terminal VSS which are connected across the secondary battery 1, an overcurrent detection terminal VM connected to one terminal of the sense resistor 4, and a control terminal CNT connected to the switch circuit 3.

The first voltage comparator circuit 7 has an inverting input terminal connected to the overcurrent detection terminal VM, a non-inverting input terminal connected to the first reference voltage circuit 5, and an output terminal connected to a gate terminal of the first PMOS transistor 9. The power supply voltage detection circuit 30 is connected between the power supply terminal VDD and the power supply terminal VSS, and has an output terminal connected to a gate terminal of the second PMOS transistor 10 via the buffer circuit 37. The first current source 14 and the second current source 15 are connected to the capacitor 13 to form a delay circuit. The delay circuit has an output terminal connected to the control circuit 2. The first PMOS transistor 9 is connected between the first current source 14 and the power supply terminal VDD, and the second PMOS transistor 10 is connected between the second current source 15 and the power supply terminal VDD.

The above-mentioned battery state monitoring circuit 23 operates as follows to function to protect the battery device 22 from an overcurrent.

If a load connected between the external terminals +VO and −VO of the battery device 22 has a problem and an abnormal current flows, a voltage across the sense resistor 4 is increased. Then, when the voltage of the sense resistor 4 exceeds a voltage of the first reference voltage circuit 5, the first voltage comparator circuit 7 detects an overcurrent and outputs a signal of L. The first PMOS transistor 9 is turned ON, and accordingly the capacitor 13 is charged with a current of the first current source 14. The control circuit 2 receives a detected signal from the delay circuit after a predetermined delay time period. Then, the control circuit 2 turns OFF the switch circuit 3 to interrupt a current path.

If the load becomes a short-circuit state and a larger amount of current flows, a voltage of the secondary battery 1 is abruptly decreased. On this occasion, if a power supply voltage, which is the voltage of the secondary battery 1, is decreased to be lower than a detection voltage of the power supply voltage detection circuit 30, the power supply voltage detection circuit 30 detects the load short-circuit state and outputs a detected signal of L. The second PMOS transistor 10 is turned ON when receiving the detected signal of L via the buffer circuit 37. Therefore, the capacitor 13 is charged with the current of the first current source 14 and a current of the second current source 15. In other words, the delay time period is shortened so that the control circuit 2 may turn OFF the switch circuit 3 more rapidly.

Further, the battery state monitoring circuit 23 according to the embodiment of the present invention protects the battery device 22 from an overcurrent also in the following condition. For example, in the case where the secondary battery 1 has not been charged sufficiently or the secondary battery 1 has degraded because of the life, the voltage of the secondary battery 1 is abruptly decreased by an overcurrent even before the load becomes the short-circuit state. The voltage of the secondary battery 1 is abruptly decreased even though the voltage across the sense resistor 4 has not been increased to be as high as that of the case of the load short-circuit state. This kind of decrease in power supply voltage cannot be detected by the second voltage comparator circuit 8 of the conventional battery state monitoring circuit 21, but can be detected by the power supply voltage detection circuit 30 of the battery state monitoring circuit 23 according to the embodiment of the present invention.

Hereinafter, referring to a specific circuit example of the power supply voltage detection circuit 30, an operation thereof is described. The power supply voltage detection circuit 30 includes PMOS transistors 31 and 32, NMOS transistors 33 and 34, and a capacitor 35. The PMOS transistors 31 and 32 together form a current mirror circuit connected to the power supply terminal VDD. The NMOS transistors 33 and 34 together form a current source connected to the power supply terminal VSS. The capacitor 35 is connected between each of the PMOS transistors 31 and 32 and the power supply terminal VSS.

The NMOS transistors 33 and 34 each have a gate terminal supplied with a bias voltage from a terminal 36, thereby allowing a constant current to flow. The constant currents flow through the PMOS transistors 31 and 32 as well, which form the current mirror circuit. Here, the current flowing through the PMOS transistor 32 is set to be larger than the current flowing through the NMOS transistor 34. Therefore, when a voltage at the power supply terminal VDD is in a normal state, each of the transistors allows a predetermined current to flow, and the power supply voltage detection circuit 30 outputs a signal of H as a non-detected signal. In this case, the capacitor 35 is charged to a value obtained by subtracting a threshold voltage Vtp of the PMOS transistors 31 and 32 from the voltage at the power supply terminal VDD.

If the voltage at the power supply terminal VDD decreases abruptly, a source voltage of the PMOS transistors 31 and 32 decreases abruptly to be lower than the voltage of the capacitor 35, that is, a gate voltage thereof. The PMOS transistors 31 and 32 are turned OFF because the source voltage becomes lower than the gate voltage. In this case, the NMOS transistor 34 is controlled to allow a predetermined current to flow, and hence the power supply voltage detection circuit 30 outputs a signal of L as a detected signal.

Figure 2:
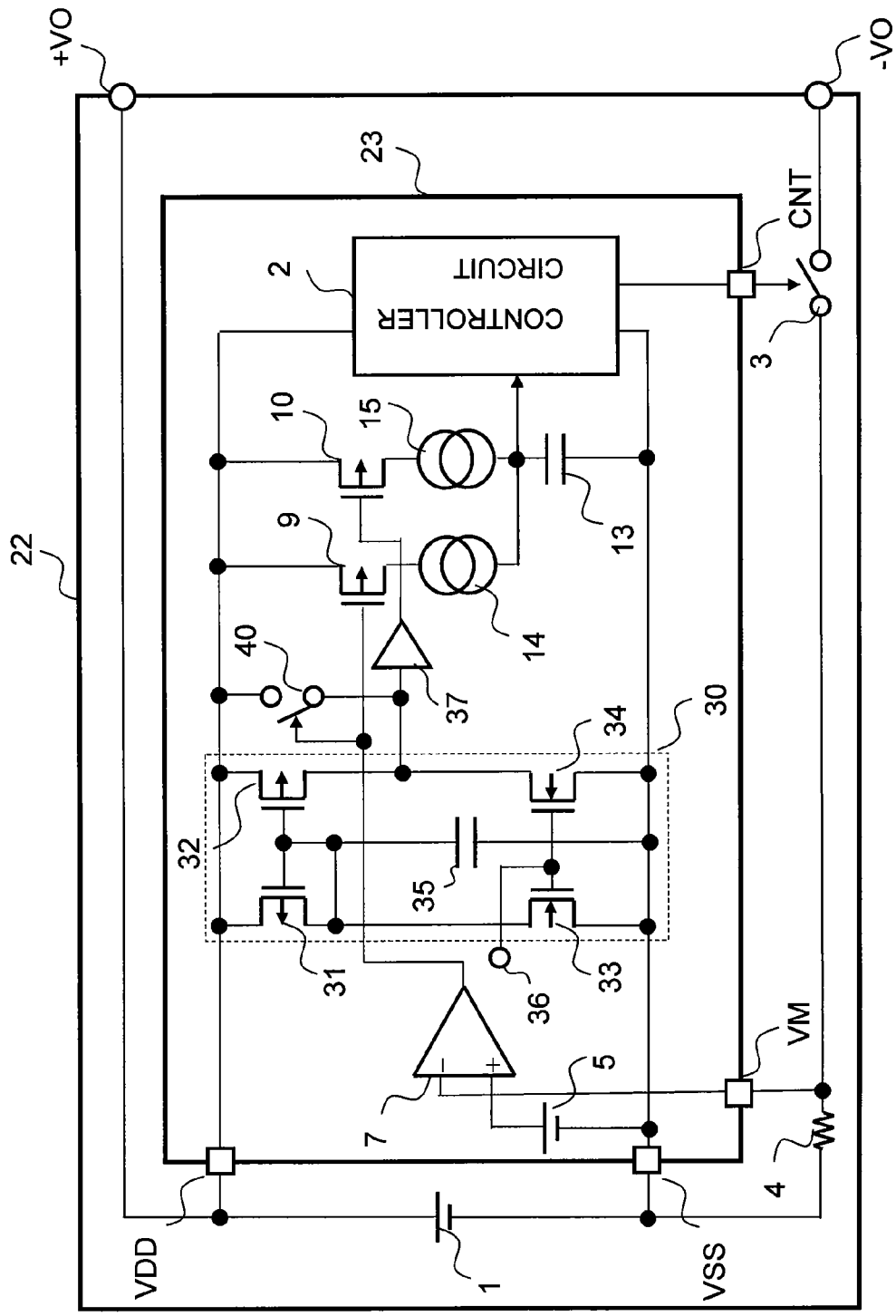
FIG. 2 is a circuit diagram illustrating another example of the battery device including the battery state monitoring circuit according to the embodiment of the present invention.
Figure 3:
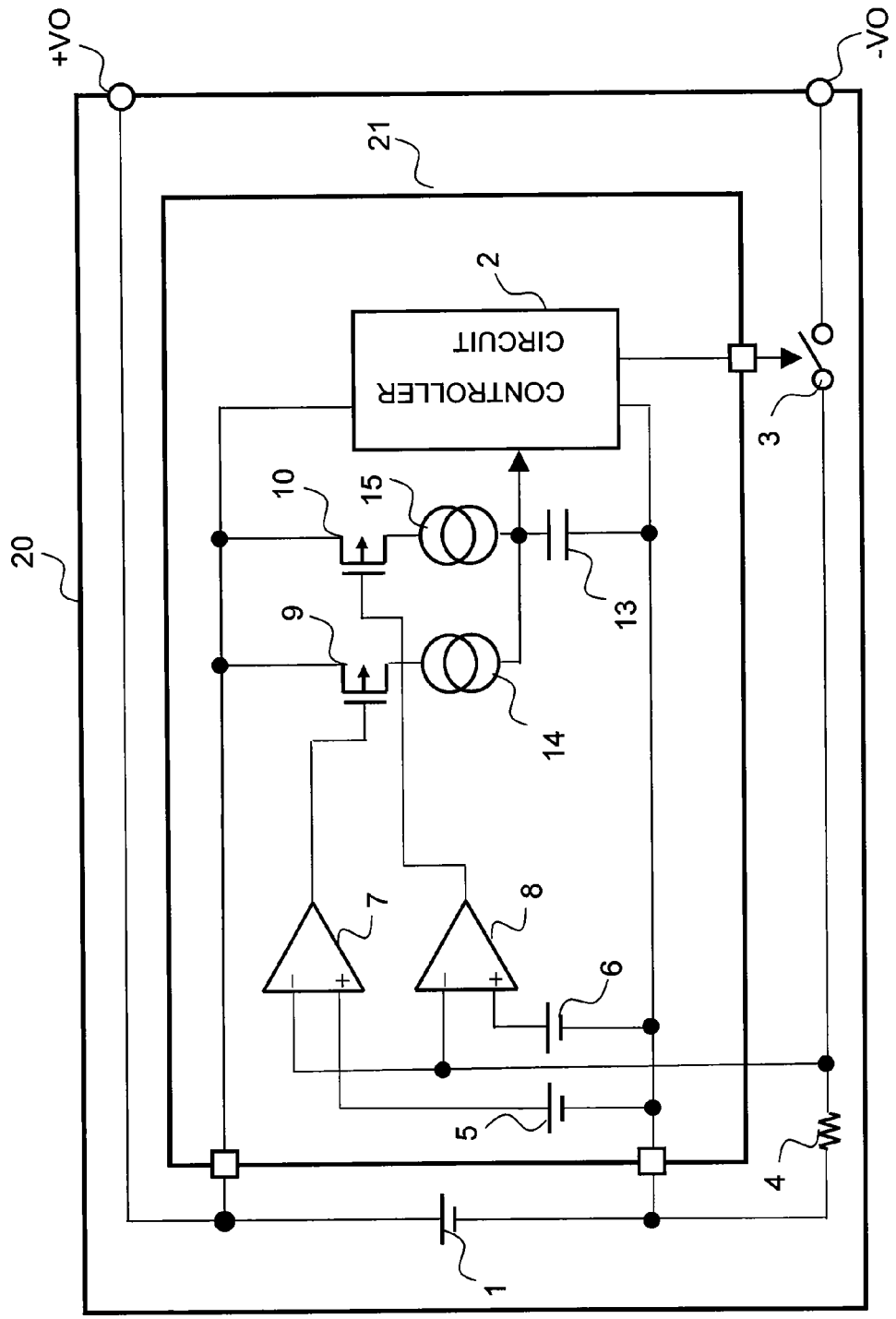
FIG. 3 is a circuit diagram illustrating a conventional battery device.

FIG. 2 is a circuit diagram illustrating another example of the battery device including the battery state monitoring circuit according to the embodiment of the present invention.

A battery state monitoring circuit 23 of FIG. 2 includes a switch circuit 40. The switch circuit 40 is connected between the power supply terminal VDD and the output terminal of the power supply voltage detection circuit 30, and is controlled by an output signal of the first voltage comparator circuit 7.

When the first voltage comparator circuit 7 has not detected an overcurrent, the switch circuit 40 connects the output terminal of the power supply voltage detection circuit 30 to the power supply terminal VDD. When the first voltage comparator circuit 7 detects the overcurrent, the switch circuit 40 is turned OFF. Accordingly, the output of the power supply voltage detection circuit 30 is effective only when the first voltage comparator circuit 7 detects the overcurrent. Therefore, the power supply voltage detection circuit 30 operates as a circuit for detecting a decrease in power supply voltage in case of overcurrent.

Note that, in the battery state monitoring circuit according to the embodiment of the present invention, the delay circuit is formed by the first current source 14, the second current source 15, and the capacitor 13. Alternatively, however, the delay circuit may be two delay circuits having different delay time periods.

The battery state monitoring circuit according to the embodiment of the present invention is described by way of example, in which the first voltage comparator circuit 7 detects the overcurrent while the power supply voltage detection circuit 30 detects the load short-circuit state. Alternatively, however, the battery state monitoring circuit may be configured such that the first voltage comparator circuit 7 detects the overcurrent, the second voltage comparator circuit 8 detects the load short-circuit state, and the power supply voltage detection circuit 30 detects the decrease in power supply voltage caused under the load short-circuit state. In this case, independent delay circuits may be provided and connected to the first voltage comparator circuit 7 and the second voltage comparator circuit 8.

As described above, according to the battery device including the battery state monitoring circuit according to the embodiment of the present invention, in the case where the secondary battery 1 is not charged sufficiently or the secondary battery 1 has degraded because of the life, the battery device can be protected from the abrupt decrease in voltage of the secondary battery 1 because of the overcurrent even before the load becomes the short-circuit state.

Besides, by using the power supply voltage detection circuit 30, the battery state monitoring circuit can be realized with a simple circuit and a small consumption current as compared to the conventional battery state monitoring circuit constituted by the reference voltage circuit 6 and the voltage comparator circuit 8.

What is claimed is:

1. A battery state monitoring circuit, comprising:
   a first reference voltage circuit;
   a first voltage comparator circuit for comparing a reference voltage of the first reference voltage circuit and a voltage at an overcurrent detection terminal;
   a power supply voltage detection circuit which is provided between two power supply voltage terminals, for detecting an abrupt decrease in a power supply voltage;
   a first PMOS transistor including a gate connected to an output terminal of the first voltage comparator circuit;
   a second PMOS transistor including a gate connected to an output terminal of the power supply voltage detection circuit;
   a first delay circuit which is connected to a drain of the first PMOS transistor;
   a second delay circuit which is connected to a drain of the second PMOS transistor; and
   a control circuit which is connected to an output terminal of the first delay circuit and an output terminal of the second delay circuit.

2. A battery state monitoring circuit according to claim 1, wherein the two power supply voltage terminals comprise:
   a power supply terminal VDD; and
   a power supply terminal VSS, and
   wherein the power supply voltage detection circuit comprises:
   a current mirror circuit which is formed of two PMOS transistors and connected to the power supply terminal VDD;
   current sources which are connected between the two PMOS transistors and the power supply terminal VDD and the power supply terminal VSS, respectively; and
   a capacitor which is connected to gates of the two PMOS transistors.

3. A battery state monitoring circuit according to claim 2, wherein:
   the first delay circuit comprises a first current source and a first capacitor which are connected in series; and
   the second delay circuit comprises a second current source and a second capacitor which are connected in series.

4. A battery state monitoring circuit according to claim 3, wherein the first capacitor and the second capacitor are formed in common.

5. A battery state monitoring circuit according to claim 2, further comprising:
   a second reference voltage circuit;
   a second voltage comparator circuit for comparing a reference voltage of the second reference voltage circuit and the voltage at the overcurrent detection terminal;
   a third PMOS transistor including a gate connected to an output terminal of the second voltage comparator circuit; and
   a third delay circuit which is connected to a drain of the third PMOS transistor,
   wherein the second reference voltage circuit detects an overcurrent, the first voltage comparator circuit detects a load short-circuit state, and the power supply voltage detection circuit detects a decrease in the power supply voltage.

6. A battery state monitoring circuit according to claim 1, further comprising a switch circuit which is provided between the output terminal of the power supply voltage detection circuit and the power supply terminal VDD,
   wherein, when an overcurrent is detected, the switch circuit is turned OFF so that an output of the power supply voltage detection circuit becomes effective.

7. A battery device, comprising:
   a secondary battery, a sense resistor, and a charge/discharge control switch circuit which are connected in series between two external terminals; and
   the battery state monitoring circuit according to claim 1, including:
   two power supply terminals which are connected across the secondary battery;
   an overcurrent detection terminal which is connected to the sense resistor; and
   a control terminal which is connected to the charge/discharge control switch circuit.

* * * * *